United States Patent
Petrella et al.

(10) Patent No.: US 6,950,309 B2
(45) Date of Patent: Sep. 27, 2005

(54) POWER AMPLIFIER MODULE ASSEMBLY

(75) Inventors: Thomas A. Petrella, Burlington, WI (US); Mark A. Keck, Carpentersville, IL (US); Jennifer K. Odze, Schaumburg, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/786,661

(22) Filed: Feb. 25, 2004

(65) Prior Publication Data

US 2005/0185383 A1    Aug. 25, 2005

(51) Int. Cl.[7] ............................................. H05K 7/20
(52) U.S. Cl. ...................... 361/719; 361/704; 361/718; 361/720; 257/718; 257/719; 165/80.3; 165/185
(58) Field of Search ................................ 361/687–690, 361/704, 715, 718–721, 796; 165/80.2, 80.3, 165/185; 174/16.1, 252; 257/712, 718, 719

(56) References Cited

U.S. PATENT DOCUMENTS

| | | | |
|---|---|---|---|
| 5,087,888 A | | 2/1992 | Mountz et al. |
| 5,411,199 A | | 5/1995 | Suppelsa et al. |
| 5,428,504 A | | 6/1995 | Bhatla |
| 5,521,792 A | * | 5/1996 | Pleitz et al. ................. 361/715 |
| 5,546,275 A | * | 8/1996 | Moutrie et al. ............. 361/707 |
| 5,610,799 A | * | 3/1997 | Kato ........................... 361/752 |
| 5,754,402 A | * | 5/1998 | Matsuzaki et al. .......... 361/707 |
| 5,831,826 A | * | 11/1998 | Van Ryswyk ................ 361/719 |
| 6,636,429 B2 | * | 10/2003 | Maly et al. .................. 361/818 |
| 6,771,507 B1 | * | 8/2004 | Belady et al. ............... 361/704 |

OTHER PUBLICATIONS

The Bergquist Company, "Thermal Materials: Sil-Pad Products" 2003, http://www.bergquistcompany.com/tm_sil_pad_detail.cfm?oid =104265.

* cited by examiner

Primary Examiner—Boris Chervinsky
(74) Attorney, Agent, or Firm—Barbara R. Doutre

(57) ABSTRACT

A power amplifier module assembly (100) includes a PA module (102) having a flange (104) and a mounting bracket (106) coupled thereto. A thermally conductive pad (108) having an electrically conductive surface (110) that couples to the mounting bracket (106) and the flange (104) via a chassis (204) so as to provide both shielding and thermal dissipation to the PA module (102).

14 Claims, 1 Drawing Sheet

POWER AMPLIFIER MODULE ASSEMBLY

TECHNICAL FIELD

This invention relates in general to power amplifier modules and more particularly to the thermal dissipation and shielding of such modules.

BACKGROUND

Electronic assemblies used in two-way radios and other electronic devices which emit or are used in the vicinity of radio frequency and electromagnetic radiation require a means of thermal dissipation and sometimes require shielding from electromagnetic and radio frequency interference (EMI and RFI). One such assembly is the radio frequency power amplifier (RF PA) module. Various RF PA module assemblies are in use today.

One example of a prior art RF PA module assembly includes a PA module having straight leads hand soldered to a printed circuit board (pcb). An opening in the pcb is used for the body of the module. A flange is coupled to the PA module and mates with a heat sink, such as a radio chassis, either directly or with a thermal interface, such as a thin pad or grease, and is fastened to the chassis with screws. This assembly provides thermal dissipation from the module to the heat sink, however no shielding is provided.

Another example of a known RF PA module assembly includes having the PA module mounted upside-down and fastened with screws to a one or two piece bracket. The bracket is hand soldered to a pcb. The leads of the PA module are either bent so that the bottom edge of the leads is flush with the pcb or the leads are inserted into thru holes and extend through the pcb. In both cases the leads are hand soldered. A flange is coupled to the RF PA module and mates with the heat sink either directly or with a thermal interface, such as a thin pad or grease, providing thermal dissipation. Here again, no shielding is provided.

Products incorporating the PA module configurations described above typically use separate shielding apparatus such as cans or fences with pop off tops in order to minimize the emissions emanating from the PA module assembly. However, these shields are typically located around the module pcb and do not enclose the entire module or the leads. While this type of shielding may provide sufficient protection for some EMI/RFI standards, such as FCC, it is inadequate for other standards, such as ETSI. Designers are faced with many challenges in obtaining optimal thermal dissipation for the PA module to run efficiently and optimal shielding of PA module to meet the EMI/RFI United States and international standards. The prior art assemblies do not provide adequate shielding of the PA module and therefore may not meet all of the EMI/RFI standards. The prior art assemblies fail to provide a robust design with adequate tolerances. As such, dynamic movement under mechanical environments may apply stress to the leads of the module causing shearing of the leads or cracks in the solder joints. All of these problems are exacerbated when designing for the tight space requirements of portable communication devices.

Accordingly, a need exists for a power amplifier module assembly that overcomes the noted problems of thermal dissipation and shielding.

BRIEF DESCRIPTION OF THE DRAWINGS

The features of the present invention, which are believed to be novel, are set forth with particularity in the appended claims. The invention, together with further objects and advantages thereof, may best be understood by reference to the following description, taken in conjunction with the accompanying drawings, in the several figures of which like reference numerals identify like elements, and in which:

DETAILED DESCRIPTION OF THE PREFERRED EMBODIMENT

Figure 1:
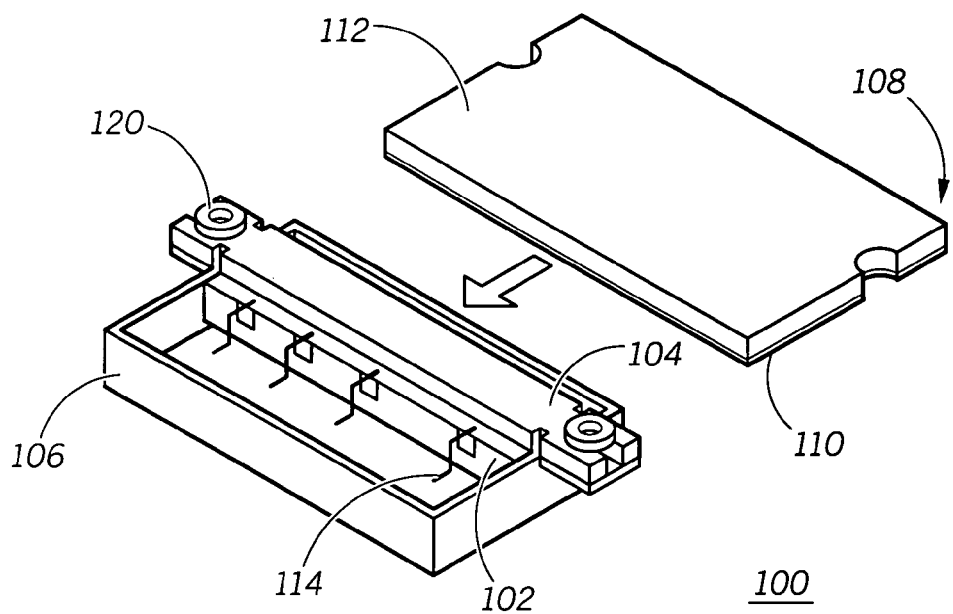
FIG. 1 is a power amplifier module assembly in accordance with the present invention.

While the specification concludes with claims defining the features of the invention that are regarded as novel, it is believed that the invention will be better understood from a consideration of the following description in conjunction with the drawing figures, in which like reference numerals are carried forward.

In accordance with the present invention, there is provided herein an improved power amplifier module assembly. In accordance with the present invention, the assembly includes a flange, a mounting bracket, and a thermally conductive pad having an electrically conductive surface on one side coupled to a power amplifier module. When mounted between a substrate and a heat sink, the assembly provides thermal dissipation, EMI/RFI shielding, and tolerance in the assembly.

FIG. 1 is a power amplifier module assembly in accordance with the present invention. Assembly 100 includes PA module 102 having a flange 104 and mounting bracket 106 coupled thereto. The flange 104 is soldered to the PA module 102 and then coupled to the mounting bracket 106 with screws, clips or other attachment means. In accordance with the present invention, the mounting bracket 106 forms a fence that surrounds the PA module 102. The flange 104 and mounting bracket 106 may be formed of a variety of electrically conductive materials such as cold rolled steel, stainless steel or beryllium copper to name a few. The leads 114 of PA module 102 are stamped with a lead bend that is co-planar with the mounting bracket 106. The PA module 102 is preferably assembled upside down into the mounting bracket and then the leads 114 are stamped again to ensure co-planarity with the mounting bracket 106 to allow for machine, pick and place mounting and reflow to a substrate. Assembly 100 eliminates the need for manual placement.

In accordance with the present invention, a thermally conductive pad 108 having an electrically conductive surface 110 on one side and a non-electrically conductive surface 112 on the other side is provided for compressible coupling to the mounting bracket 106 and the flange 104 so as to enclose the PA module 102. The electrically conductive surface 110 may be formed of copper foil, aluminum foil or other suitable metal. The thermally conductive pad 108 gets coupled, preferably adhesively coupled, through the non-electrically conductive surface 112, to a heat sink, such as a radio chassis, 204 shown in FIG. 2. The thermally conductive pad 108 is coupled to the heat sink 204 to align and provide a compressible fit to the mounting bracket 106 and flange 104.

The selection of the thermally conductive pad 108 should be based on the design parameters for a given product. The thermally conductive pad 108 should be chosen to provide effective thermal transfer of heat away from the PA module 102 such that maximum temperatures are not exceeded and the module runs efficiently. The level of RF shielding to be provided by the electrically conductive surface 110 is design dependent as well depending on the standards specifications that are required for a given product. The thickness and the durometer of the pad 108 are selected to take up the tolerances in the design and dynamic movement under mechanical environments providing a robust assembly.

Figure 2:
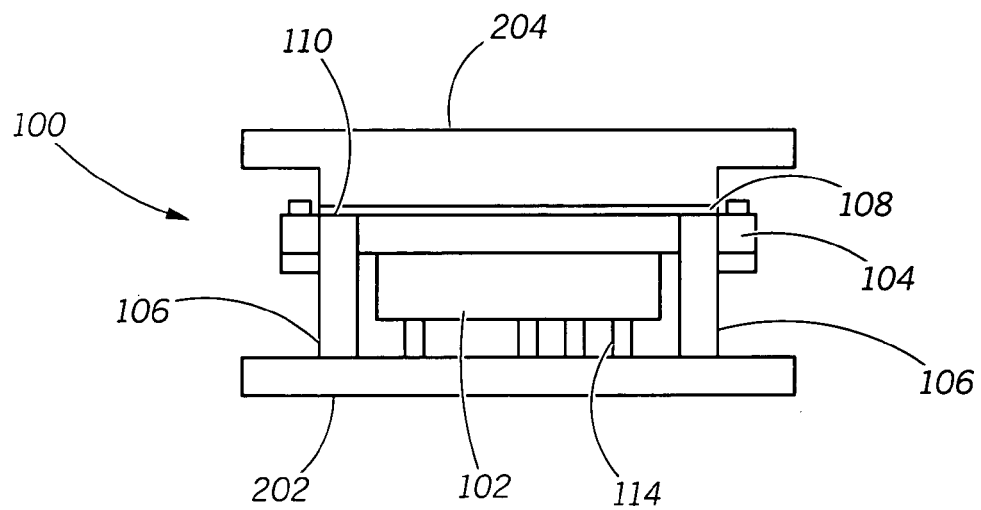
FIG. 2 is a cross sectional view of the power amplifier module assembly of the present invention in a communication device.

FIG. 2 shows a cross sectional view of the power amplifier module assembly 100 of the present invention mounted in a communication device, such as a radio, 200. The communication device 200 includes a substrate 202, such as a printed circuit board, and a heat sink, such as a radio chassis, 204 with the PA module assembly 100 of the present invention coupled therebetween. The non-electrically conductive surface 112 of the thermally conductive pad 108 is coupled, preferably adhesively coupled, to the chassis 204 and is aligned so that the electrically conductive surface 110 mates with the perimeter of the mounting bracket 106 when the substrate 202 is assembled to the chassis.

In accordance with the present invention, the PA module 102 is mounted to substrate 202 via leads 114 and mounting bracket 106. The mounting bracket 106 and thermally conductive pad 108 form a shield for PA module 102 with the mounting bracket providing walls and the electrically conductive surface 110 of the pad providing a top. The flange 104 and pad 108 provide a path for transferring heat to the chassis 204. Thus, assembly 100 provides both shielding and thermal dissipation for PA module 102.

The power amplifier module assembly 100 of the present invention can be machine placed and reflowed onto the substrate 202 using automated manufacturing processes thereby eliminating errors associated with human intervention and hand soldering. Assembly 100 facilitates the placement of the PA module 102 onto the substrate 202 and placement of the substrate relative to the chassis 204. The robust mounting of the module lends itself well to a variety of environments, such as temperature shock, drop, and vibration. The need for any cut out in the substrate has been eliminated.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A power amplifier module assembly, comprising:
a power amplifier module with a flange coupled thereto;
a mounting bracket coupled to the flange and surrounding the power amplifier module;
a thermally conductive pad having an electrically conductive surface on one side for coupling to the mounting bracket and the flange so as to enclose the power amplifier module.

2. The power amplifier module assembly of claim 1, wherein the thermally conductive pad is compressibly coupled to the mounting bracket and flange via a heat sink.

3. The power amplifier module assembly of claim 2, wherein the heat sink comprises a chassis.

4. The power amplifier module assembly of claim 3, wherein the chassis comprises a radio chassis.

5. An assembly for a power amplifier module, comprising:
a flange coupled to the amplifier module;
a mounting bracket coupled to the flange and providing a fence around the power amplifier module; and
a thermally conductive pad, the thermally conductive pad having an electrically conductive surface on one side and a non-electrically conductive surface on the other side, the electrically conductive surface for coupling to the mounting bracket and flange, and the non-electrically conductive surface for coupling to a heat sink.

6. The assembly of claim 5, wherein the assembly is surface mountable.

7. The assembly of claim 6, wherein the power amplifier module has leads characterized by a lead bend that is co-planar with the mounting bracket.

8. The assembly of claim 7, wherein the power amplifier module is assembled upside down into the mounting bracket.

9. The assembly of claim 5, wherein the thermally conductive pad provides both thermal dissipation and shielding to the power amplifier module.

10. The assembly of claim 5, wherein the heat sink comprises a chassis of a communication device.

11. The assembly of claim 10, wherein the communication device comprises a radio.

12. A communication device, including:
a substrate;
a power amplifier module coupled to the substrate;
a mounting bracket coupled to the substrate and surrounding the power amplifier module;
a flange coupled to the amplifier module and the mounting bracket; and
a chassis having a thermally conductive pad coupled thereto, the thermally conductive pad having an electrically conductive surface, the electrically conductive surface for coupling to the mounting bracket and the flange so as to enclose the power amplifier module thereby providing shielding, the thermally conductive pad for transferring heat away from the flange to the chassis.

13. The communication device of claim 12, wherein the thermally conductive pad is coupled to the chassis through a non-electrically conductive surface, and the electrically conductive surface is compressibly coupled to the flange and mounting bracket.

14. The communication device of claim 12, wherein the communication device comprises a radio.

* * * * *